United States Patent [19]

Kovalick

[11] 4,347,434
[45] Aug. 31, 1982

[54] HAND HELD DATA BUS ANALYZER

[75] Inventor: Albert Kovalick, Santa Clara, Calif.

[73] Assignee: Hewlett-Packard Company, Palo Alto, Calif.

[21] Appl. No.: 113,009

[22] Filed: Jan. 18, 1980

[51] Int. Cl.³ ............................................ G01R 31/02
[52] U.S. Cl. ........................ 235/92 SH; 235/92 DE; 324/72.5
[58] Field of Search ........ 235/92 SH, 92 MT, 92 CV, 235/92 MS, 92 T, 92 DE; 340/146.3 SY; 324/72, 72.5, 73 PC, 133, 149

[56] References Cited

U.S. PATENT DOCUMENTS

| 3,238,501 | 3/1966 | Mak et al. | 340/146.3 SY |
| 3,480,911 | 11/1969 | Danna | 340/146.3 SY |
| 3,750,015 | 7/1973 | Sheker et al. | 324/72.5 |
| 4,048,478 | 9/1977 | Miwa et al. | 235/92 T |

Primary Examiner—Joseph M. Thesz
Attorney, Agent, or Firm—David A. Boone; Theodore S. Park

[57] ABSTRACT

A hand held logic probe serially clocks applied data bits into a shift register in response to a user actuated thumb switch. The shift register is coupled to a hexidecimal-/octal converter which drives a digital display. The display is reset in response to the user actuating the thumb switch for more than a predetermined time period.

6 Claims, 6 Drawing Figures

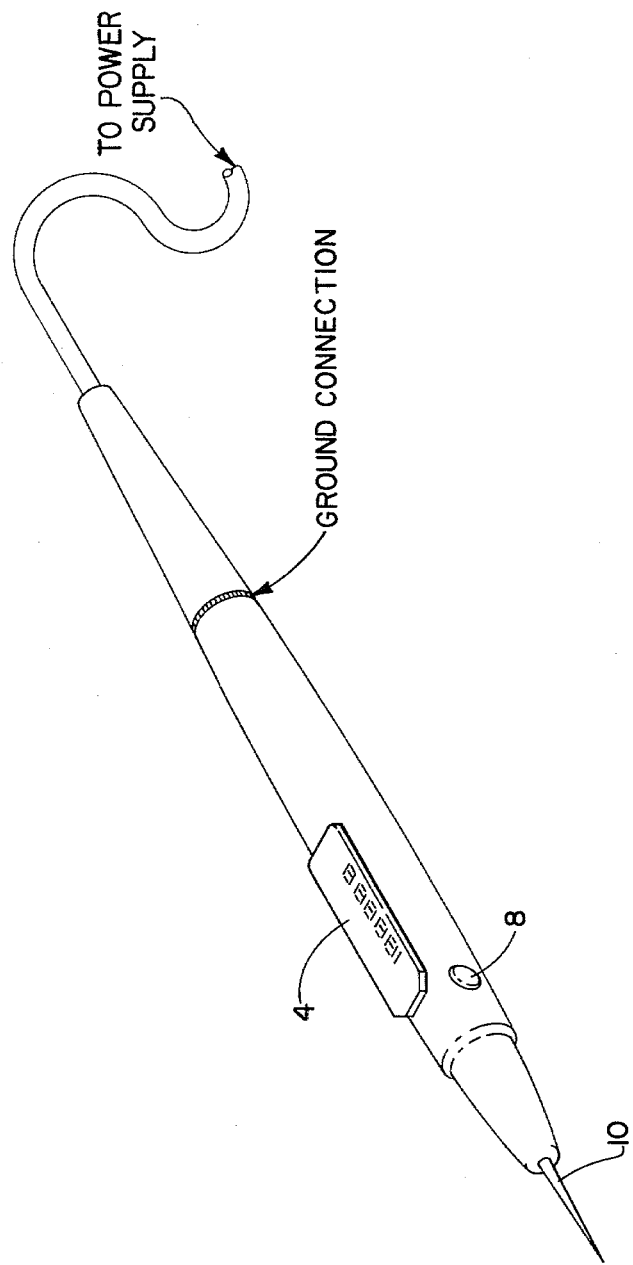

HAND HELD DATA BUS ANALYZER

BACKGROUND OF THE INVENTION

It is frequently required to read the contents of a data bus when working with digital systems. Several current methods exist to do this. Assuming a bus width of 16 bits and a clocked system, the typical method is to use a logic analyzer having parallel inputs and a clock input. Each clock transition causes all 16 bits to be read and displayed on the logic analyzer display. The user must move all 16 logic probe inputs to the bus under investigation if the system has many data paths in order to make a measurement.

All data, addresses and control paths are stable after each clock step if the continuous clock is replaced by a single step clock. This single step method is useful in the development and repair of digital systems and can be used with the parallel logic analyzer described above. It is also possible to use a binary logic probe, DC meter or scope to detect logic levels and each bit sense is detected in sequence thereby constituting a serial approach. The advantage of a serial approach is that it is not necessary to move all 16 logic probes each time a different data path is analyzed. The disadvantage of the serial approach is that after each bit is sensed the value must be read and then written down. Only after all 16 bits are measured can the 16 bit value be hand converted into a useful hexidecimal or octal data value.

SUMMARY OF THE INVENTION

A hand held logic probe serially clocks applied data bits into a shift register in response to a user actuated switch. The shift register is coupled to a binary converter which drives a display. The display is reset in response to the user actuating the switch for more than a predetermined time period.

DESCRIPTION OF THE DRAWING

FIG. 3 is a drawing of an external view of the preferred embodiment.

DESCRIPTION OF THE PREFERRED EMBODIMENT

Figure 1:
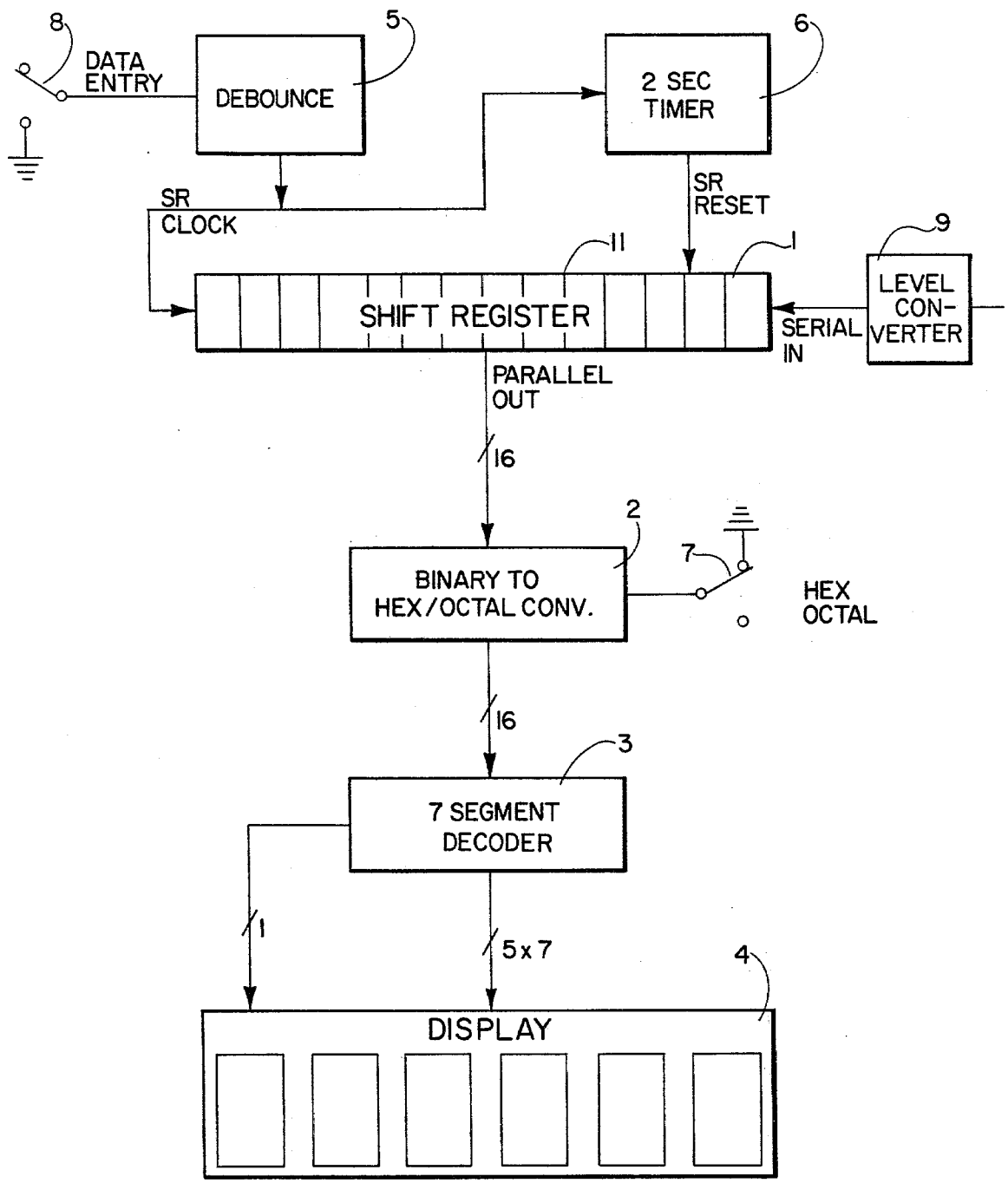
FIG. 1 is a block diagram of a preferred embodiment built in accordance with the invention.

Referring to FIG. 1, the level of a bit to be sensed is entered via a probe point 10. A level converter 9 adjusts for different logic levels especially ECL, TTL and CMOS. Once the logic level is stable, a user presses a switch 8 to clock in the data point. Switch 8 is debounced by debounce logic 5 which produces a clock pulse in response to closure of the switch 8. Each clock pulse shifts a serial bit into a serial in/parallel out shift register 11. The output of the shift register 11 is applied to a binary to hex/octal converter 2. The output of the hex/octal converter 2 is applied to a seven segment display decoder 3 which drives a LED type display 4 or other digital display.

A switch 7 is coupled to the binary to hex/octal conv 2 and selects between hexidecimal or octal displays. If switch 8 is held down for greater than 2 seconds a 2 sec timer 6 causes the shift register reset 1 to clear. The display 4 will then display all zeros.

Figure 2:
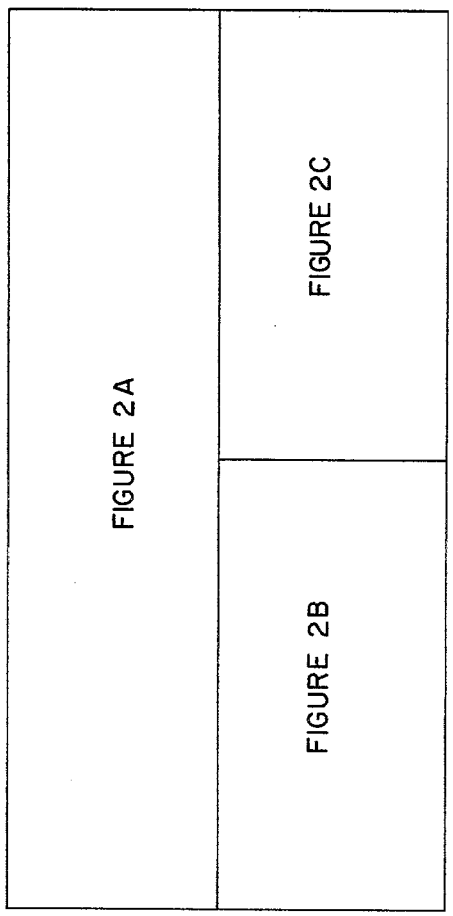
FIGS. 2 and 2A-C comprise a detailed schematic diagram of a preferred embodiment built in accordance with the invention.
Figure 2A:
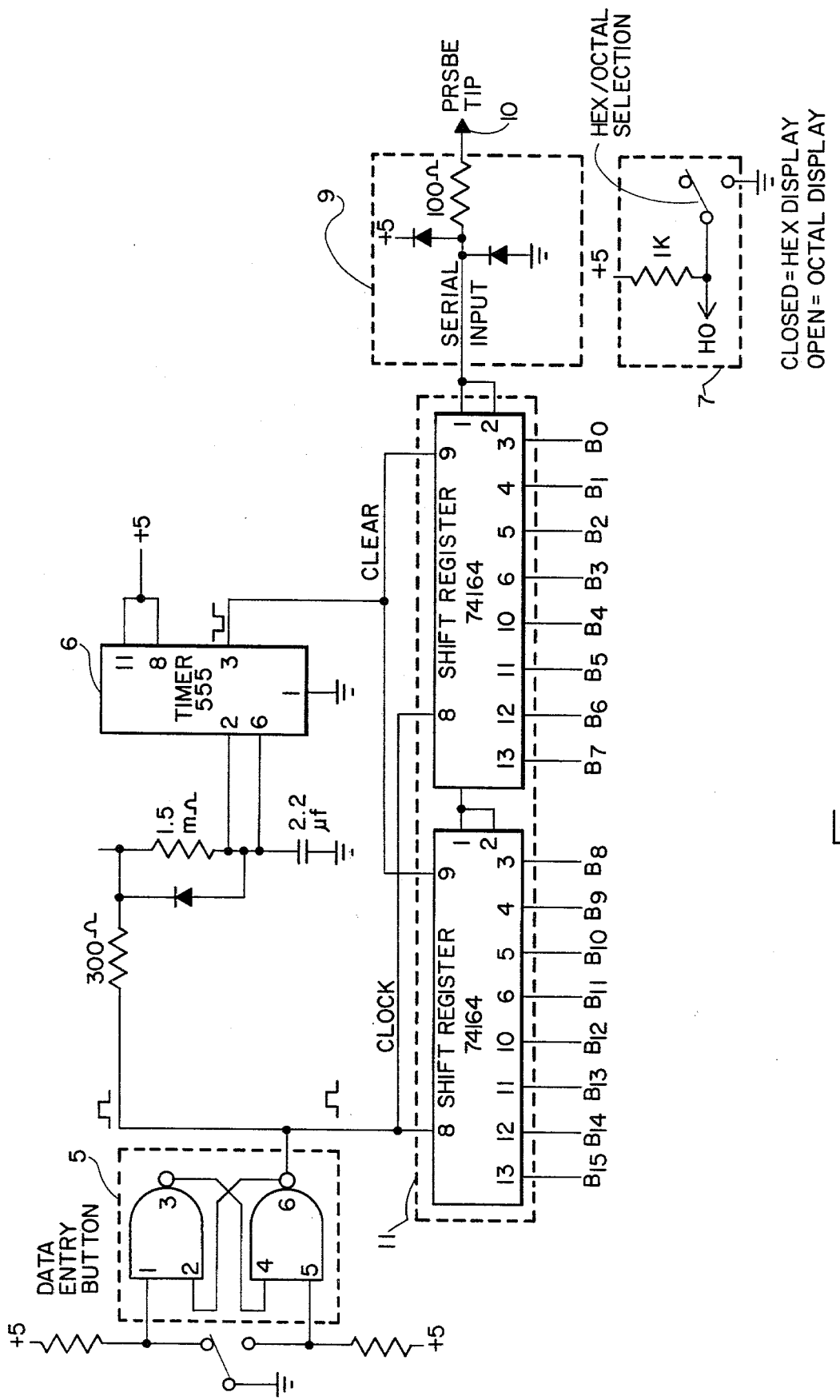
Figure 2B:
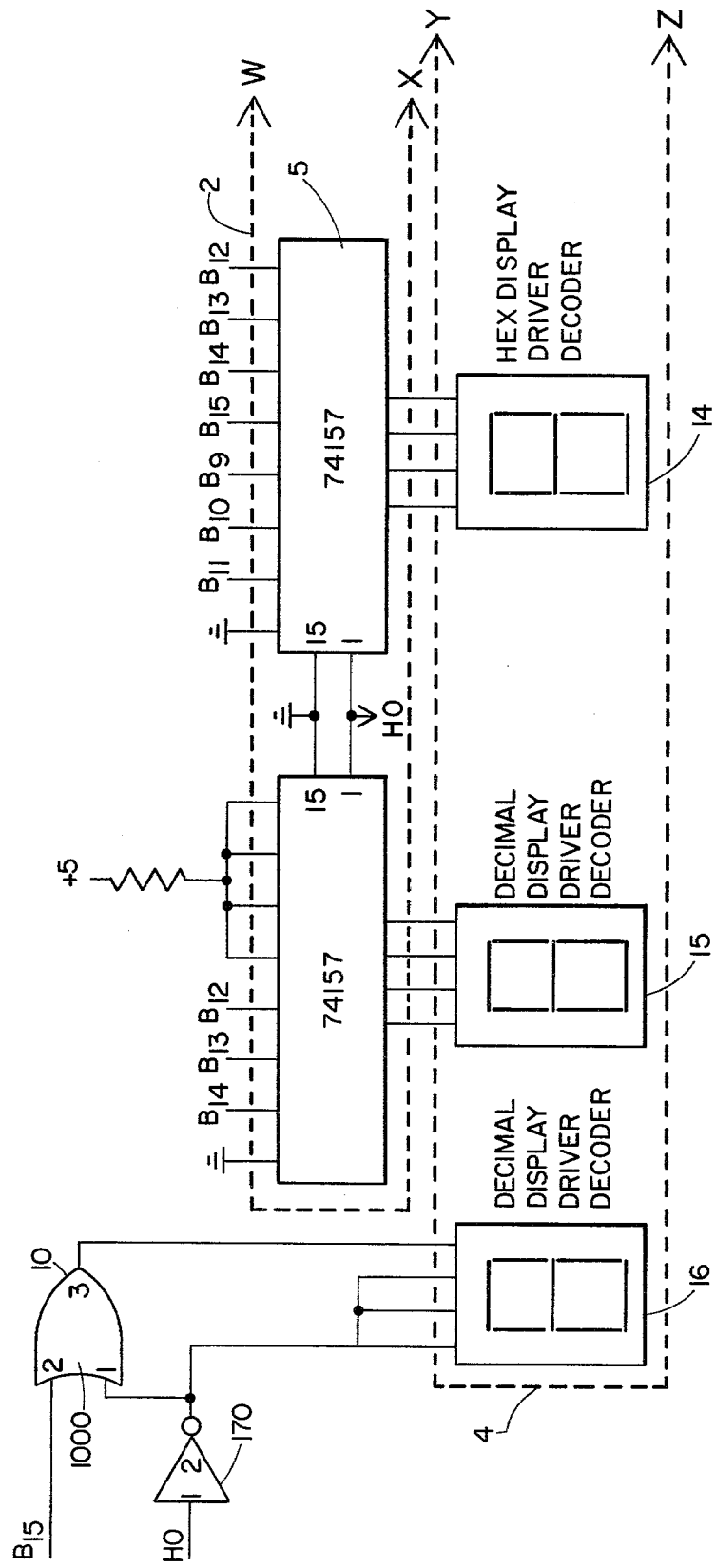
Figure 2C:
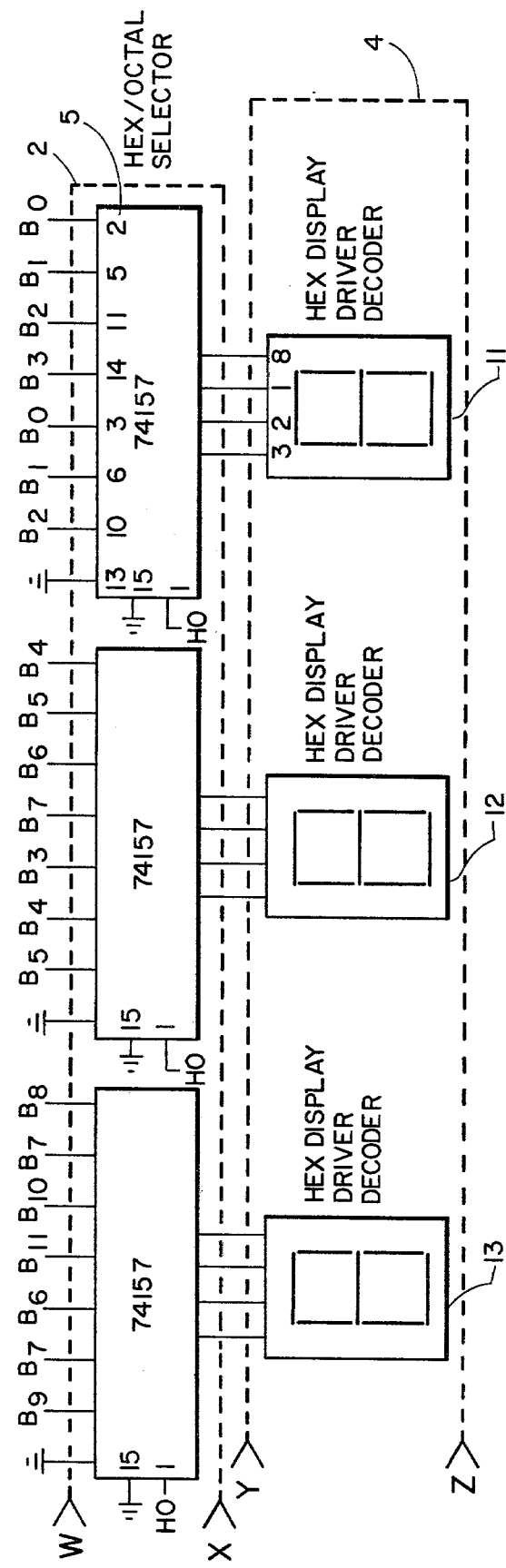

Referring to FIG. 2, a detailed schematic diagram of a preferred embodiment is shown. A parts list of off the shelf components to construct the device is given in the table below:

| PARTS LIST TTL LOGIC | | |
|---|---|---|
| Unit | Part No. | Function |
| 5 | 7400 | NAND |
| 6 | 555 | TIMER |
| 11 | 74164 | Two 8 bit SHIFT REGISTER |
| 2 | 74157 | Five 2 to 1 MULTIPLIER |
| 1000 | 7432 | OR |
| 4 | 5082-7340 | Four HEX DISPLAYS, HEWLETT-PACKARD COMPANY |
| 4 | 5082-7300 | Two DECIMAL DISPLAYS, HEWLETT-PACKARD COMPANY |
| 170 | 7404 | INVERTER |

Referring to FIG. 3, a typical package is shown. All circuitry shown in FIG. 1 is preferably integrated on to 1 or more integrated chips thereby allowing a small package configuration to provide a single hand held probe having a digital display. In operation, a user activates a single momentary push button 8 for clocking in each serial bit. This button 8 is also used to reset the display 4. As each serial bit is hand clocked into the probe, the equivalent octal or hex value appears in the display. If, for example, the stable address for a memory module is 0001010111010110 in binary, then after all 16 bits are hand clocked into the probe (msb first) the digital display will read 15D6 in hex notation or 12726 in octal.

The present invention saves the user time in making measurements. The parallel data value of any stable data path can be read in less time with this method and only requires one hand of the user to operate.

I claim:

1. Logic level sensing and storage apparatus for assembling a digital word in a selected sequence from a data paths, said apparatus comprising:
    a probe tip;
    a shift register means coupled to said probe tip for containing a digital word therein;
    a display means coupled to said shift register means for displaying a visual indication of said digital word;
    a manually activated switch coupled to said shift register means; and
    means for clocking a representation of a first data bit on a data path in electrical contact with said probe tip into said shift register means in response to activation of said manually activated switch.

2. Apparatus as in claim 1 wherein said shift register means resets in response to a reset control signal and wherein said apparatus further comprises a means for timing coupled to said manual switch and said shift register means to provide said reset control signal in response to said manual switch being activated for a selected period of time.

3. Apparatus as in claim 1 and further comprising a level converter for coupling said probe tip to said shift register means.

4. Apparatus as in claim 1 further comprising a binary-to-hexadecimal converter for coupling said shift register means output to said display means.

5. Apparatus as in claim 1 further comprising a binary-to-octal converter for coupling said shift register means output to said display means.

6. Apparatus as in claim 1 wherein the contents of said shift register means is shifted within said shift register means and a new data bit is added to the contents within said shift register means, in response to activation of said manually activated switch.

* * * * *